United States Patent
Shi et al.

(10) Patent No.: US 11,977,824 B2
(45) Date of Patent: May 7, 2024

(54) METHOD AND DEVICE FOR CREATING KINEMATIC PAIR OBJECTS, AND STORAGE MEDIUM

(71) Applicant: CONTEMPORARY AMPEREX TECHNOLOGY CO., LIMITED, Ningde (CN)

(72) Inventors: Deqiang Shi, Ningde (CN); Maosen Lin, Ningde (CN); Xuming Wang, Ningde (CN); Lang Yang, Ningde (CN); Runqi Wu, Ningde (CN)

(73) Assignee: CONTEMPORARY AMPEREX TECHNOLOGY CO., LIMITED, Ningde (CN)

(*) Notice: Subject to any disclaimer, the term of this patent is extended or adjusted under 35 U.S.C. 154(b) by 0 days.

(21) Appl. No.: 18/448,935

(22) Filed: Aug. 12, 2023

(65) Prior Publication Data

US 2024/0104260 A1 Mar. 28, 2024

Related U.S. Application Data

(63) Continuation of application No. PCT/CN2023/085042, filed on Mar. 30, 2023.

(30) Foreign Application Priority Data

Sep. 22, 2022 (CN) .......................... 202211160854.7

(51) Int. Cl.
  *G06F 30/17* (2020.01)
(52) U.S. Cl.
  CPC .................... *G06F 30/17* (2020.01)

(58) Field of Classification Search
  CPC .................... G06F 30/00; G06F 30/17
  (Continued)

(56) References Cited

U.S. PATENT DOCUMENTS

2017/0282370 A1* 10/2017 Kapeller ............... B25J 9/1676
2021/0374560 A1   12/2021 Alameh et al.

FOREIGN PATENT DOCUMENTS

CN        102073771 A       5/2011
CN        111459101 A       7/2020
              (Continued)

OTHER PUBLICATIONS

Hou, Zhili, et al., "Design and Simulation of 3-DOF Reconfigurable Planar Parallel Robot", 2016, MATEC Web of Conferences 82, The Authors, EDP Sciences. (Year: 2016).*

(Continued)

*Primary Examiner* — Cedric Johnson
(74) *Attorney, Agent, or Firm* — ANOVA LAW GROUP, PLLC

(57) ABSTRACT

A method for creating kinematic pair objects. Kinematic pairs are included in a first facility. The first facility is equipped with control software. The method includes obtaining a first file that includes names of N kinematic pairs, calling the control software to read the names of the N kinematic pairs in the first file, and calling the control software to create N kinematic pair objects. N is an integer greater than or equal to 1. The N kinematic pair objects are determined based on the names of the N kinematic pairs read by the control software. The names of the N kinematic pairs are in one-to-one correspondence to the N kinematic pair objects.

13 Claims, 3 Drawing Sheets

(58) Field of Classification Search
USPC .......................................................... 703/7, 6
See application file for complete search history.

(56) References Cited

FOREIGN PATENT DOCUMENTS

| | | |
|---|---|---|
| CN | 113971315 A | 1/2022 |
| CN | 114665790 A | 6/2022 |
| CN | 114840196 A | 8/2022 |
| CN | 115840616 A | 3/2023 |

OTHER PUBLICATIONS

Zhou, Wan-chun et al., "The Innovative Design of Airliner Front Landing Gear Mechanism", Jan. 3, 2012, Advanced Materials Research, Trans Tech Publications Ltd. (Year: 2012).*
The World Intellectual Property Organization (WIPO) International Search Report and Written Opinion for PCT/CN2023/085042 dated Jul. 6, 2023 17 pages (with translation).
The China National Intellectual Property Administration (CNIPA) The First Office Action for Chinese Application 202211160854.7 dated May 25, 2023 19 Pages (With Translation).

* cited by examiner

METHOD AND DEVICE FOR CREATING KINEMATIC PAIR OBJECTS, AND STORAGE MEDIUM

CROSS-REFERENCE TO RELATED APPLICATIONS

This application is a continuation of International Application No. PCT/CN2023/085042, filed on Mar. 30, 2023, which claims priority to Chinese Patent Application No. 202211160854.7, filed with the China National Intellectual Property Administration on Sep. 22, 2022 and entitled "METHOD AND DEVICE FOR CREATING KINEMATIC PAIR OBJECTS, AND STORAGE MEDIUM", which are incorporated herein by reference in their entirety.

TECHNICAL FIELD

This application relates to the technical field of virtual simulation, and in particular, to a method and device for creating kinematic pair objects, and a storage medium.

BACKGROUND

Virtual simulation is a technology of creating a digital model through simulation software and simulating and debugging a production process, a robot program, a programmable logic controller (PLC) program, and the like in a real workshop based on the digital model.

Currently, to create kinematic pairs in a virtual simulation debugging environment, an engineer needs to create kinematic pair objects one by one. The quantity of equipment to be virtually debugged is large, and more than hundreds of different kinematic pairs need to be created for each piece of equipment. Consequently, the actual operation process is complicated and lengthy, and the work efficiency is low. In addition, the operation process of creating kinematic pair objects one by one is cumbersome and complicated, and manual processing is prone to incur misoperation or omission of operation, thereby delaying the subsequent virtual simulation debugging work.

Therefore, how to implement batch creation of kinematic pair objects to improve the work efficiency in the virtual simulation debugging process has become an urgent technical problem in this field.

SUMMARY

Some embodiments of this application provide a method and device for creating kinematic pair objects, and a storage medium to improve efficiency of creating kinematic pair objects during virtual simulation.

According to a first aspect, a method for creating kinematic pair objects is provided. Each kinematic pair is included in a first facility. The first facility is equipped with control software. The method includes: obtaining a first file, where the first file includes names of N kinematic pairs, N being an integer greater than or equal to 1; calling the control software to read the names of the N kinematic pairs in the first file; and calling the control software to create N kinematic pair objects, where the N kinematic pair objects are determined based on the names of the N kinematic pairs read by the control software, and the names of the N kinematic pairs are in one-to-one correspondence to the N kinematic pair objects.

In the technical solution of this application, the first file that includes the names of N to-be-created kinematic pairs is obtained first, the control software is called to read the names of the N kinematic pairs in the first file, and then the control software creates N kinematic pair objects, thereby automatically creating kinematic pair objects and sub-objects. Compared with the related art, the technical solution hereof effectively improves efficiency of creating the kinematic pair objects and sub-objects, and significantly reduces the error rate and labor cost in manual operations.

In some possible implementations, the calling the control software to create N kinematic pair objects includes: obtaining a first resource node; and calling the control software to create the N kinematic pair objects on the first resource node.

In the above implementation, during creation of kinematic pair objects, the first resource node may be obtained first, and the control software is called to create kinematic pair objects on the first resource node, thereby creating the kinematic pair objects accurately and meeting the requirements of different tasks. Compared with the related art, the technical solution hereof effectively improves efficiency of creating the kinematic pair objects and sub-objects, and significantly reduces the error rate and labor cost in manual operations.

In some possible implementations, the method further includes: calling the control software to create sub-objects of the N kinematic pair objects on the N kinematic pair objects, where the N kinematic pair objects correspond to the sub-objects of the N kinematic pair objects.

In the above implementation, after a kinematic pair object is created, sub-objects of the kinematic pair object may be further created on the kinematic pair object by the control software, thereby automatically creating the kinematic pair objects and sub-objects, and meeting the requirements of different tasks.

Specifically, in an embodiment of this application, the sub-objects of the kinematic pair objects include at least one of: a link object, a joint object, and a pose object. The link object includes a parent link object and a child link object. The joint object is determined by the parent link object and the child link object. The pose object includes a pose open object and a pose closing object.

In a possible implementation, default values of parameters of the N kinematic pair objects are identical.

Specifically, in an embodiment of this application, the identical default values of the parameters of the created N kinematic pair objects mean that the created N kinematic pair objects have the same value for the same parameter. This makes it convenient to create a large number of kinematic pair objects in batches simultaneously, and effectively improves the efficiency of creating kinematic pair objects and sub-objects.

In some possible implementations, the method further includes: if the first file is not obtained, or if a format of the obtained first file is incorrect, then calling the control software to output first information. The first information is used as an instruction to obtain the first file again.

In the above implementation, in a process of obtaining the first file, if the first file is not obtained, or if the format of the obtained first file fails to meet requirements, the control software may be called to output the first information. The first information is used as an instruction to obtain the first file again, thereby ensuring accuracy of the obtained first file, and improving the work efficiency of creating kinematic pair objects during virtual simulation.

In some possible implementations, the method further includes: if the first resource node is not obtained, or if a node type of the obtained first resource node is incorrect, then calling the control software to output second information. The second information is used as an instruction to obtain the first resource node again.

In the above implementation, in a process of creating the N kinematic pair objects, if the first resource node is not obtained, or if the type of the obtained first resource node is incorrect, that is, if the to-be-created kinematic pair object does not correspond to the first resource node, then the control software may be called to output the second information. The second information is used as an instruction to obtain the first resource node again, thereby ensuring the accuracy of the obtained first resource node and the matching between the type of the first resource node and the to-be-created kinematic pair, and in turn, improving the work efficiency of creating kinematic pair objects during virtual simulation.

Specifically, in an embodiment of this application, a format of the first file may include one of: excel, xml, csv, or txt table.

In some possible implementations, the kinematic pair includes a cylinder shaft or a servo shaft.

In some possible implementations, the method further includes: calling the control software to generate log information. The log information includes input information and output information. The output information includes first information and second information.

In the above implementation, after a plurality of kinematic pair objects are created, the control software may be called to generate log information. The log information may record the input information and output information generated in creating the kinematic pair objects. When an error occurs during virtual debugging, troubleshooting may be performed based on the log information, thereby improving accuracy of creating kinematic pair objects during virtual simulation.

According to a second aspect, a device for creating kinematic pair objects is provided. Each kinematic pair is included in a first facility. The first facility is equipped with control software. The device includes:

an obtaining module, configured to obtain a first file, where the first file includes names of N kinematic pairs, N being an integer greater than or equal to 1; and a processing module, configured to call the control software to read the names of the N kinematic pairs in the first file.

The processing module is further configured to call the control software to create N kinematic pair objects. The N kinematic pair objects are determined based on the names of the N kinematic pairs read by the control software. The names of the N kinematic pairs are in one-to-one correspondence to the N kinematic pair objects.

In the technical solution of this application, the first file that includes the names of N to-be-created kinematic pairs is obtained first, the control software is called to read the names of the N kinematic pairs in the first file, and then the control software creates N kinematic pair objects, thereby automatically creating kinematic pair objects and sub-objects. Compared with the related art, the technical solution hereof effectively improves efficiency of creating the kinematic pair objects and sub-objects, and significantly reduces the error rate and labor cost in manual operations.

In some possible implementations, the obtaining module is further configured to obtain a first resource node, and the processing module is further configured to call the control software to create the N kinematic pair objects on the first resource node.

In the above implementation, during creation of kinematic pair objects, the first resource node may be obtained first, and the control software is called to create kinematic pair objects on the first resource node, thereby creating the kinematic pair objects accurately and meeting the requirements of different tasks. Compared with the related art, the technical solution hereof effectively improves efficiency of creating the kinematic pair objects and sub-objects, and significantly reduces the error rate and labor cost in manual operations.

In some possible implementations, the processing module is further configured to call the control software to create sub-objects of the N kinematic pair objects on the N kinematic pair objects. The N kinematic pair objects correspond to the sub-objects of the N kinematic pair objects.

In the above implementation, after a kinematic pair object is created, sub-objects of the kinematic pair object may be further created on the kinematic pair object by the control software, thereby automatically creating the kinematic pair objects and sub-objects, and meeting the requirements of different tasks.

Specifically, in an embodiment of this application, the sub-objects of the kinematic pair objects include at least one of: a link object, a joint object, and a pose object. The link object includes a parent link object and a child link object. The joint object is determined by the parent link object and the child link object. The pose object includes a pose open object and a pose closing object.

In a possible implementation, if the obtaining module fails to obtain the first file, or if a format of the first file obtained by the obtaining module is incorrect, then the processing module is further configured to call the control software to output first information. The first information is used as an instruction to obtain the first file again.

In the above implementation, in a process of obtaining the first file, if the first file is not obtained, or if the format of the obtained first file fails to meet requirements, the control software may be called to output the first information. The first information is used as an instruction to obtain the first file again, thereby ensuring accuracy of the obtained first file, and improving the work efficiency of creating kinematic pair objects during virtual simulation.

In a possible implementation, if the obtaining module fails to obtain the first resource node, or if a node type of the first resource node obtained by the obtaining module is incorrect, then the processing module is further configured to call the control software to output second information. The second information is used as an instruction to obtain the first resource node again.

In the above implementation, in a process of creating the N kinematic pair objects, if the first resource node is not obtained, or if the type of the obtained first resource node is incorrect, that is, if the to-be-created kinematic pair object does not correspond to the first resource node, then the control software may be called to output the second information. The second information is used as an instruction to obtain the first resource node again, thereby ensuring the accuracy of the obtained first resource node and the matching between the type of the first resource node and the to-be-created kinematic pair, and in turn, improving the work efficiency of creating kinematic pair objects during virtual simulation.

Specifically, in an embodiment of this application, a format of the first file may include one of: excel, xml, csv, or txt table.

In some possible implementations, the kinematic pair includes a cylinder shaft or a servo shaft.

In some possible implementations, the processing module is further configured to call the control software to generate log information. The log information includes input information and output information. The output information includes first information and second information.

In the above implementation, after a plurality of kinematic pair objects are created, the control software may be called to generate log information. The log information may record the input information and output information generated in creating the kinematic pair objects. When an error occurs during virtual debugging, troubleshooting may be performed based on the log information, thereby improving accuracy of creating kinematic pair objects during virtual simulation.

According to a third aspect, a device for creating kinematic pair objects is provided. The device includes a processor and a memory. The memory is configured to store a program. The processor is configured to call the program from the memory and run the program to perform the method for creating kinematic pair objects according to the first aspect or any one possible implementation of the first aspect.

According to a fourth aspect, a computer-readable storage medium is provided, including a computer program. When executed on a computer, the computer program causes the computer to perform the method for creating kinematic pair objects according to the first aspect or any one possible implementation of the first aspect.

According to a fifth aspect, a computer program product that includes an instruction is provided. When executed by a computer, the instruction causes the computer to perform the method for creating kinematic pair objects according to the first aspect or any one possible implementation of the first aspect.

BRIEF DESCRIPTION OF DRAWINGS

To describe the technical solutions of the embodiments of this application more clearly, the following outlines the drawings used in the embodiments of this application. Evidently, the drawings outlined below are merely a part of embodiments of this application. A person of ordinary skill in the art may derive other drawings from the outlined drawings without making any creative efforts.

Figure 1:
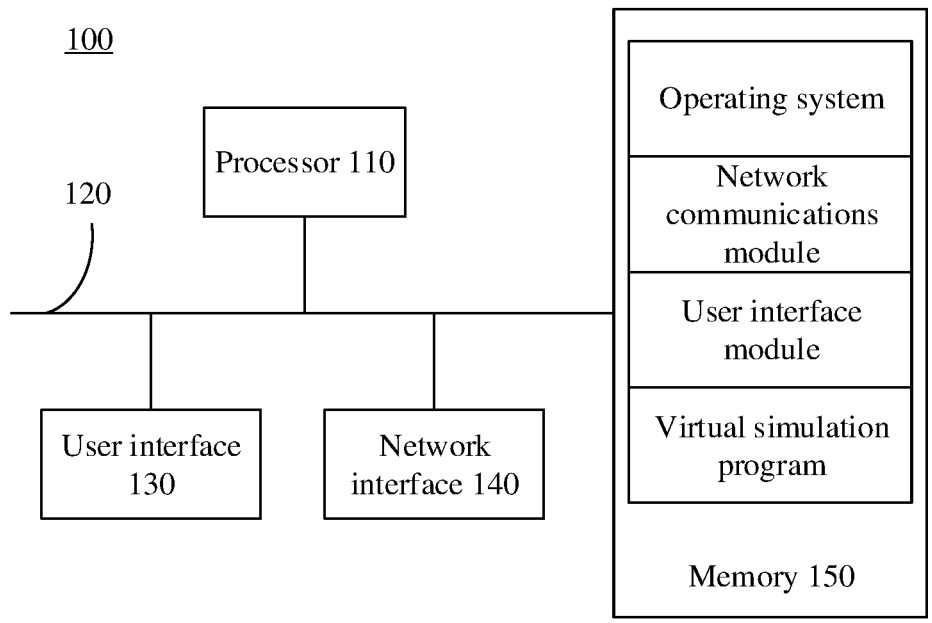
FIG. 1 is a schematic structural diagram of a virtual simulation device according to an embodiment of this application.

The drawings are not necessarily drawn to scale.

DETAILED DESCRIPTION OF EMBODIMENTS

The following gives a more detailed description of implementations of this application with reference to drawings and embodiments. The detailed description of the following embodiments and drawings are intended to describe the principles of this application illustratively, but not to limit the scope of this application. Therefore, this application is not limited to the described embodiments.

It is hereby noted that, unless otherwise defined, all technical and scientific terms used in the description of this application bear the same meanings as what is normally understood by a person skilled in the technical field of this application. The terms used herein are merely intended to describe specific embodiments but not to limit this application. The terms "include" and "contain" and any variations thereof used in the specification, claims, and brief description of drawings of this application are intended as non-exclusive inclusion. "A plurality of" means at least two in number. The terms such as "up", "down", "left", "right", "in", and "out" indicating a direction or a position relationship are merely intended for ease or brevity of describing this application, but do not indicate or imply that the mentioned device or component is necessarily located in the specified direction and position or constructed or operated in the specified direction and position. Therefore, such terms are not to be understood as a limitation on this application. In addition, the terms "first", "second", "third", and so on are merely used for descriptive purposes, but not construed as indicating or implying relative importance. "Perpendicular" does not means exact perpendicularity, but means perpendicularity falling within an error tolerance range. "Parallel" does not mean exact parallelism, but means parallelism falling within an error tolerance range.

Reference to "embodiment" in this application means that a specific feature, structure or characteristic described with reference to the embodiment may be included in at least one embodiment of this application. Reference to this term in different places in the specification does not necessarily represent the same embodiment, nor does it represent an independent or alternative embodiment in a mutually exclusive relationship with other embodiments. A person skilled in the art explicitly and implicitly understands that the embodiments described in this application may be combined with other embodiments.

The directional terms appearing in the following description indicate the directions shown in the drawings, but are not intended to limit specific structures in this application. In the description of this application, unless otherwise expressly specified and defined, the terms "mount", "concatenate", and "connect", are understood in a broad sense. For example, a "connection" may be a fixed connection, a detachable connection, or an integrated connection; or may be a direct connection or an indirect connection implemented through an intermediary; or may be internal communication between two components. A person of ordinary skill in the art is able to understand the specific meanings of the terms in this application according to specific situations.

The term "and/or" in this application indicates merely a relation for describing the related items, and represents three possible relationships. For example, "A and/or B" may represent the following three circumstances: A alone, both A and B, and B alone. In addition, the character "/" herein generally indicates an "or" relationship between the item preceding the character and the item following the character. In this disclosure, the phrases "at least one of A, B, and C" and "at least one of A, B, or C" both mean only A, only B, only C, or any combination of A, B, and C.

Currently, in existing mechanics, during virtual simulation debugging, a routine operation process of creating a kinematic pair object of equipment and a sub-object of the kinematic pair object is as follows: selecting a resource type to be created, and creating a kinematic pair frame to complete the creation of a resource node; renaming the kinematic pair; opening a kinematics editor corresponding to the kinematic pair; naming a parent link object (such as Parent Link) as lnk1, and naming a child link object (such as Child Link) as lnk2; connecting lnk1 to lnk2, determining a joint object (such as joint), and naming the joint object as j 1; closing the kinematics editor corresponding to the kinematic pair; opening a pose editor (such as Pose Editor); creating a pose closing object (such as CLOSE) and a pose closing object (such as OPEN) in the pose editor; and closing the pose editor.

Generally, in a practical virtual simulation process, the number of kinematic pairs that need to be created for each device is more than 300. When a plurality of kinematic pairs in one or more devices are created by the above method, the kinematic pair objects still need to be created one by one by performing the above steps. Consequently, the process of creating kinematic pair objects is complicated and lengthy, and the entire process is inefficient. In addition, due to the cumbersome and complicated operation process, errors such as omitted data or unduly added data inevitably occur in manually creating the kinematic pair objects one by one, thereby increasing the time and labor cost of rework.

In view of the facts above, this application discloses a method and device for creating kinematic pair objects, and a storage medium. In the technical solution hereof, a first file that includes the names of N to-be-created kinematic pairs is obtained first, control software is called to read the names of the N kinematic pairs in the first file, and then the control software creates N kinematic pair objects, thereby creating kinematic pair objects and sub-objects quickly in batches, significantly improving the work efficiency in the virtual simulation debugging process, and reducing the error rate, labor cost, and time cost in manual operations. The following describes in detail a method for creating kinematic pair objects according to an embodiment of this application with reference to a specific embodiment.

FIG. 1 is a schematic structural diagram of a virtual simulation device 100 applicable in an embodiment of this application.

As shown in FIG. 1, the virtual simulation device 100 may include: a processor 110, for example, a central processing unit (CPU), a communications bus 120, a user interface 130, a network interface 140, and a memory 150.

The communications bus 120 is configured to implement communication between the components. The user interface 130 may be configured to connect a display screen, an input unit (such as a keyboard), and the like. The user interface 130 may include a standard wired interface or wireless interface. The memory 150 may be a high-speed random access memory (random access memory RAM), or a stable non-volatile memory (non-volatile memory, NVM), such as a disk memory. Optionally, the memory 150 may be a storage device independent of the foregoing processor 110.

Understandably, the structure shown in FIG. 1 is merely an example, and does not constitute a limitation on the virtual simulation device referred to in this embodiment of this application.

Specifically, the memory 150 as a storage medium may include an operating system, a network communications module, a user interface module, and a virtual simulation program. Optionally, the user interface module in the memory 150 may be configured to input modeling data, and perform modeling of a virtual simulation scene. The modeling data may be obtained from a tooling library, a human body pose library, a process instruction library, a product model library, and the like in a virtual simulation program.

In the virtual simulation device involved in this embodiment of this application, the network interface 140 is configured to perform data communication with a network server; the user interface 130 is configured to perform data exchange with a user; and the processor 110 and the memory 150 may be disposed in the virtual simulation device. The virtual simulation device uses the processor 110 to call the virtual simulation program stored in the memory 150 to perform various virtual simulation operations.

Understandably, in this embodiment of this application, the virtual simulation device may be referred to as a first facility, which, as an example, does not constitute any limitation on this embodiment of this application.

For example, the virtual simulation program involved in this embodiment of this application may be Process Simulate software under Tecnomatix. Tecnomatix, as a working environment for building a virtual simulation scene, is a comprehensive set of digital manufacturing solutions, and can digitalize a manufacturing process and a process by which innovative ideas and raw materials are transformed into an actual product. Process Simulate is simulation software that can run on an industrial computer, corresponds to a virtual device on site, includes a motion mechanism and a logic block, and can perform related actions in response to a control signal of a PLC and feed back an execution result to the PLC. The main function of Process Simulate is to implement offline programming and simulation verification of a digitalized model.

Figure 2:
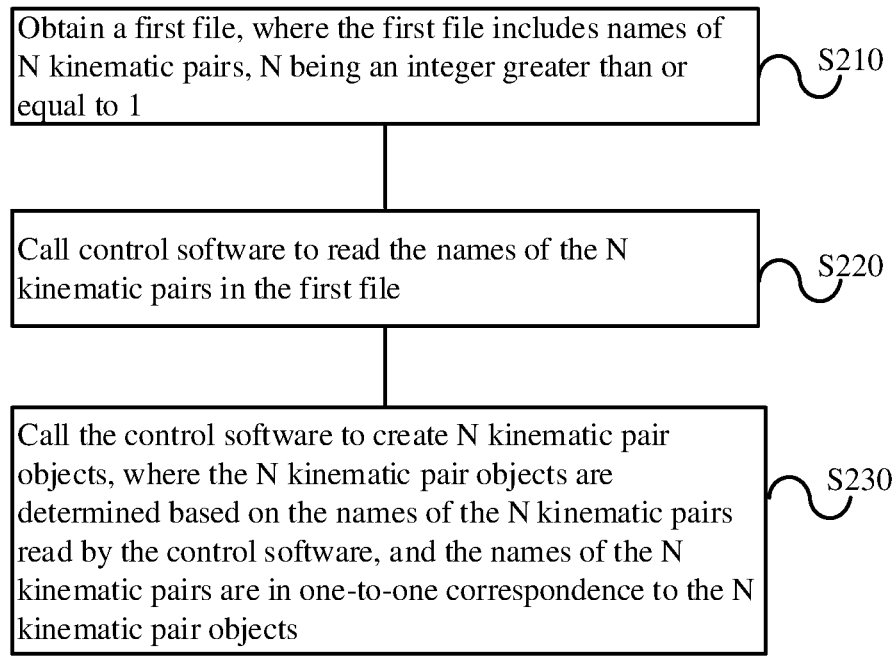
FIG. 2 is a schematic flowchart of a method for creating kinematic pair objects according to an embodiment of this application.

FIG. 2 is a schematic flowchart of a method 200 for creating kinematic pair objects according to an embodiment of this application. As shown in FIG. 2, the method includes steps S210 to S230.

In this embodiment of this application, a kinematic pair is a movable connection formed by direct contact between two members that actuates relative movement. Elements that participate in the contact on the two members and thereby constitute points, lines, surfaces, and the like of the kinematic pair are referred to as kinematic pair elements.

In a possible implementation, kinematic pairs may be classed into a lower pair and a higher pair depending on the contact condition between the two members. A kinematic pair formed by surface contact between the two members is called a lower pair. Depending on the form of relative movement between the two members, lower pairs are further classed into a sliding pair and a turning pair. Specifically, a lower pair formed by two members that move rectilinearly relative to each other is called a sliding pair; and a lower pair formed by two members that turn or revolve relative to each other is called a hinge pair. A kinematic pair formed by point contact or surface contact between two members is called a higher pair, as in wheel-and-rail, cam-and-follower, gear turning, and the like.

In a possible implementation, the kinematic pairs may be classified depending on the form of relative movement. If the relative movement between the two members of a kinematic pair is a planar movement, the kinematic pair is called a planar kinematic pair. If the relative movement between the two members of a kinematic pair is a spatial movement, the kinematic pair is called a spatial kinematic pair. A kinematic pair of two members that move in the form of only relative revolution around each other is called a turning pair, and a kinematic pair of two members that move in the form of only relative movement to each other is called a sliding pair.

Optionally, in a possible implementation, a method 100 for creating kinematic pair objects according to an embodiment of this application may be executed by a plug-in (such as an AutoCreteResource plug-in) obtained by secondarily developing the Process Simulate software under Tecnomatix by use of the C Sharp language under the Visual Studio software. Alternatively, the method 100 may be executed by other software or devices, which, as an example, does not constitute any limitation on this embodiment of this application.

Understandably, the plurality of kinematic pairs involved in this embodiment of this application may be included in the same device, or included in a plurality of devices, which, as an example, does not constitute any limitation on this embodiment of this application.

S210. Obtain a first file, where the first file includes names of N kinematic pairs, N being an integer greater than or equal to 1.

Understandably, the names of the N kinematic pairs in the first file may be the names of the to-be-created kinematic pair objects that are automatically generated by the system and compliant with system specifications, may be the names of the kinematic pair objects that are artificially set according to actual needs, which, as an example, does not constitute any limitation on this embodiment of this application.

S220. Call the control software to read the names of the N kinematic pairs in the first file.

Specifically, in this embodiment of this application, the names of the N kinematic pairs in the first file may be read by calling virtual simulation software (such as Process Simulate software under Tecnomatix).

Understandably, the control software in this embodiment of this application may be called virtual simulation software, or called virtual simulation debugging software, which, as an example, does not constitute any limitation on this embodiment of this application.

S230. Call the control software to create N kinematic pair objects. The N kinematic pair objects are determined based on the names of the N kinematic pairs read by the control software. The names of the N kinematic pairs are in one-to-one correspondence to the N kinematic pair objects.

In a possible implementation, N kinematic pairs are created based on the read names of N kinematic pairs by calling the control software. Default values of parameters of the created N kinematic pair objects are identical. Understandably, in this embodiment of this application, based on the names of the N kinematic pair objects, the control software may create N kinematic pair objects successively, or may create N kinematic pair objects simultaneously, which, as an example, does not constitute any limitation on this embodiment of this application.

In this embodiment of this application, in contrast to the technical solution in related art in which an engineer creates kinematic pairs and sub-objects of the kinematic pairs one by one, the technical solution according to this embodiment of this application can create a plurality of kinematic pair objects and sub-objects in batches by using a plug-in obtained by secondary development of the virtual simulation software. This improves the work efficiency in the virtual debugging process effectively, reduces manual operation steps of engineers significantly in contrast to the related art, and reduces the error rate and labor cost in a manual operation process significantly.

Optionally, in some embodiments, in the method 200, the status of the first file needs to be determined after the first file is obtained. For example, the determining process is: if the first file is not obtained, or if the format of the obtained first file is incorrect, then outputting first information, where the first information is used as an instruction to obtain the first file again. The first information may be log information output by the AutoCreteResource plug-in.

Specifically, in a process of obtaining the first file, if the first file is not obtained, or if the format of the obtained first file fails to meet requirements, the control software may be called to output the first information. The first information is used as an instruction to obtain the first file again, thereby ensuring accuracy of the obtained first file, and improving the work efficiency of creating kinematic pair objects during virtual simulation.

Specifically, in an embodiment of this application, a format of the first file may include one of: excel, xml, csv, or txt table, which, as an example, does not constitute any limitation on this embodiment of this application.

Optionally, in some embodiments, the step of calling the control software to create N kinematic pair objects in the method 200 further includes: obtaining a first resource node; and calling the control software to create N kinematic pair objects on the first resource node, thereby creating the kinematic pair objects accurately and meeting the requirements of different tasks. Compared with the related art, the technical solution hereof effectively improves efficiency of creating the kinematic pair objects and sub-objects, and significantly reduces the error rate and labor cost in manual operations.

Optionally, in some embodiments, default values of parameters of the created N kinematic pair objects are identical.

Specifically, in this embodiment of this application, the identical default values of the parameters of the created N kinematic pair objects mean that the created N kinematic pair objects have the same value for the same parameter, thereby making it convenient to create a large number of kinematic pair objects in batches simultaneously, and effectively improving the efficiency of creating kinematic pair objects and sub-objects.

For example, the value of a maximum speed, that is, a first value, is the same between the N kinematic pairs created by the control software; the value of a maximum acceleration, that is, a second value, is the same between the N kinematic pairs created by the control software; and the value of a movement upper limit, that is, a third value, is the same between the N kinematic pairs created by the control software, or the value of a movement lower limit, that is, a fourth value, is the same between the N kinematic pairs created by the control software, where the third value is greater than the fourth value, which, as an example, does not constitute any limitation on this embodiment of this application.

Optionally, after the first resource node is obtained in the method 200, the status of the obtained resource node needs to be determined. The determining process is: if the first resource node is not obtained, or if a node type of the obtained first resource node is incorrect, then calling the control software to output second information. The second information is used as an instruction to obtain the resource node again.

Specifically, in the above implementation, in a process of creating the N kinematic pair objects, if the first resource node is not obtained, or if the type of the obtained first resource node is incorrect, that is, if the to-be-created kinematic pair object does not correspond to the first resource node, then the control software may be called to output the second information. The second information is used as an instruction to obtain the first resource node again, thereby ensuring the accuracy of the obtained first resource node and the matching between the type of the first resource node and the to-be-created kinematic pair, and in turn, improving the work efficiency of creating kinematic pair objects during virtual simulation.

For example, in this embodiment of this application, the types of the resource node may include: a robot, a welding torch, a jig, or other types of resource nodes. When a to-be-created kinematic pair object is subsidiary to a jig resource node, the jig resource node needs to be selected, and the kinematic pair object is created on this resource node.

Optionally, in some embodiments, after N kinematic pair objects are created by calling the control software in the method 200, sub-objects of the N kinematic pair objects may be further created on the N kinematic pair objects by calling the control software. The N kinematic pair objects correspond to the sub-objects of the N kinematic pair objects, thereby automatically creating the kinematic pair objects and sub-objects, and meeting the requirements of different tasks.

Specifically, in this embodiment of this application, the sub-objects of the kinematic pair objects include at least one of: a link object, a joint object, or a pose object. The link object includes a parent link object and a child link object, the joint object is determined by the parent link object and the child link object of the kinematic pair, and the pose object includes a pose open object and a pose closing object.

Optionally, in some embodiments, the kinematic pairs involved in this embodiment of this application may be cylinder shafts or servo shafts.

Optionally, in some embodiments, after N kinematic pair objects are created by calling the control software in the method 200, the control software may be further called to generate log information. The log information is used to record the input information and output information generated in creating the kinematic pair objects. For example, the output information may include the first information and the second information.

Specifically, after a plurality of kinematic pair objects are created, the control software may be called to generate log information. The log information may record the input information and output information generated in creating the kinematic pair objects. When an error occurs during virtual debugging, troubleshooting may be performed based on the log information, thereby improving accuracy of creating kinematic pair objects during virtual simulation.

Figure 3:
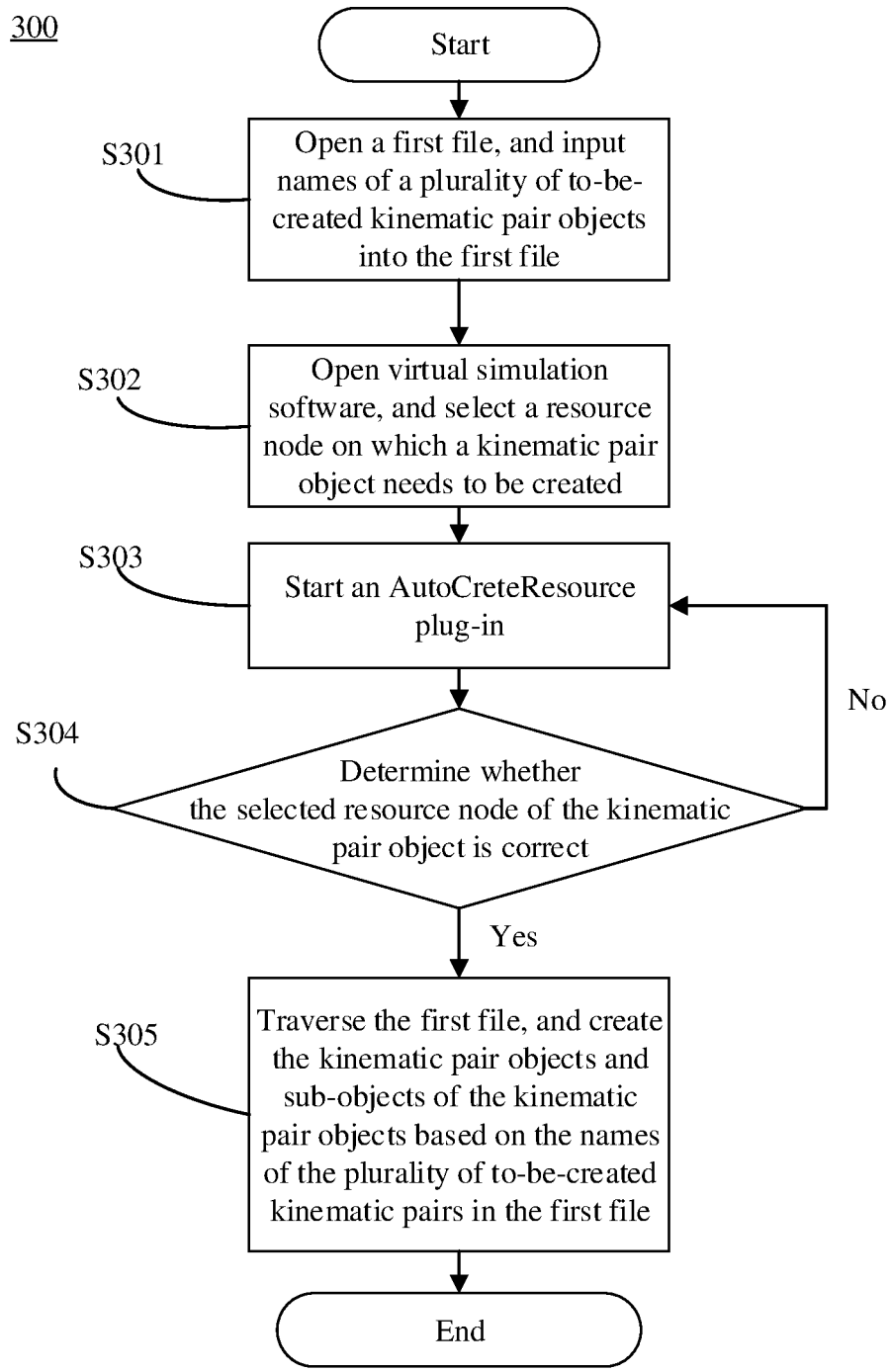
FIG. 3 is a schematic flowchart of another method for creating kinematic pair objects according to an embodiment of this application.

FIG. 3 is a schematic flowchart of a method 300 for creating kinematic pair objects according to an embodiment of this application.

As shown in FIG. 3, the method 300 for creating kinematic pair objects includes the following steps:

Step S301: Open a first file, input the names of the to-be-created kinematic pair objects into the first file, and then save and close the first file.

For example, in this embodiment of this application, the first file may be named as TableAutoCreteResource table, or the name of the first file may be user-defined according to actual needs, which, as an example, does not constitute any limitation on this embodiment of this application.

Understandably, the names of the N kinematic pairs in the first file may be the names of the to-be-created kinematic pair objects that are automatically generated by the system and compliant with system specifications, may be the names of the kinematic pair objects that are artificially set according to actual needs, which, as an example, does not constitute any limitation on this embodiment of this application.

Further understandably, in an embodiment of this application, a format of the first file may include one of: excel, xml, csv, or txt table, which, as an example, does not constitute any limitation on this embodiment of this application.

Step S302: Open virtual simulation software, and select a resource node on which a kinematic pair object needs to be created.

Understandably, in this embodiment of this application, the virtual simulation software may be Process Simulate software under Tecnomatix, which, as an example, does not constitute any limitation on this embodiment of this application.

Further understandably, in this embodiment of this application, the types of the resource node may include: a robot, a welding torch, a jig, or other types of resource nodes. When a to-be-created kinematic pair object is subsidiary to a welding torch resource node, the welding torch resource node needs to be selected, and the kinematic pair object is created on this resource node.

Step S303: Start the AutoCreteResource plug-in in the virtual simulation software.

Understandably, the AutoCreteResource plug-in is a plug-in obtained by secondarily developing the Process Simulate under Tecnomatix by use of the C Sharp language under the Visual Studio software. The name of the plug-in enumerated above is just an example. The name of the plug-in obtained by secondary development may be preset in the system or renamed according to actual needs, without being limited in this embodiment of this application.

Step S304: Determine the status of the selected resource node on which a kinematic pair object needs to be created. If the selected resource node is not obtained, or if the node type of the selected resource node is incorrect, then corresponding error indication information is output, another resource node that satisfies the condition of the to-be-created kinematic pair object is selected, and step S303 is performed again. If the selected resource node that satisfies the condition of the to-be-created kinematic pair object is correct, the process goes to step S305.

Understandably, in this embodiment of this application, step S304 may be performed during step S302, that is, step S304 may be performed on the virtual software. Alternatively, step S304 may be performed after step S303, that is, step S304 may be performed by starting the AutoCreteResource plug-in.

Step S305: Read the information in the first file, and create the kinematic pair objects and sub-objects of the kinematic pair objects based on the names of the plurality of to-be-created kinematic pair objects in the first file.

Specifically, in this embodiment of this application, the sub-objects of the kinematic pair objects include at least one of: a link object, a joint object, or a pose object. The link object includes a parent link object and a child link object, the joint object is determined by the parent link object and the child link object of the kinematic pair, and the pose object includes a pose open object and a pose closing object.

In this embodiment of this application, before step S305, that is, before reading the information in the first file, the status of the first file may be determined. For example, the determining process is: if the first file is not detected, or if the format of the read first file is incorrect, then outputting error indication information, where the error indication information is used as an instruction to obtain the first file again.

Optionally, the plug-in may generate log information automatically. The log information is used to record the input information and output information generated when the user creates the kinematic pair objects and sub-objects.

When an error occurs in the process of creating the kinematic pair objects in the virtual simulation software, troubleshooting may be performed based on the log information, thereby improving accuracy of creating kinematic pair objects during virtual simulation.

Figure 4:
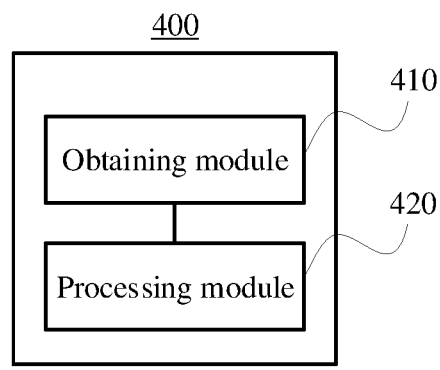
FIG. 4 is a schematic structural block diagram of a device for creating kinematic pair objects according to an embodiment of this application.

FIG. 4 is a schematic block diagram of a device 400 for creating kinematic pair objects according to an embodiment of this application. The device 400 can perform the foregoing method for creating kinematic pair objects according to an embodiment of this application. Each kinematic pair is included in a first facility. The first facility is equipped with control software.

As shown in FIG. 4, the device 400 includes:
an obtaining module 410, configured to obtain a first file, where the first file includes names of N kinematic pairs, N being an integer greater than or equal to 1; and
a processing module 420, configured to call the control software to read the names of the N kinematic pairs in the first file.

The processing module 420 is further configured to call the control software to create N kinematic pair objects. The N kinematic pair objects are determined based on the names of the N kinematic pairs read by the control software. The names of the N kinematic pairs are in one-to-one correspondence to the N kinematic pair objects.

Optionally, in an embodiment, the obtaining module 410 is further configured to obtain a first resource node. The processing module 420 is further configured to call the control software to create the N kinematic pair objects on the first resource node.

Optionally, in some embodiments, the processing module 420 is further configured to call the control software to create sub-objects of the N kinematic pair objects on the N kinematic pair objects. The N kinematic pair objects correspond to the sub-objects of the N kinematic pair objects.

Specifically, in an embodiment of this application, the sub-objects of the N kinematic pair objects include at least one of: a link object, a joint object, and a pose object. The link object includes a parent link object and a child link object. The joint object is determined by the parent link object and the child link object. The pose object includes a pose open object and a pose closing object.

Optionally, in some embodiments, default values of parameters of the N kinematic pair objects are identical.

Optionally, in some embodiments, if the obtaining module 410 fails to obtain the first file, or if a format of the first file obtained by the obtaining module 410 is incorrect, then the processing module 420 is further configured to call the control software to output first information. The first information is used as an instruction to obtain the first file again.

Optionally, in some embodiments, if the obtaining module 410 fails to obtain the first resource node, or if a node type of the first resource node obtained by the obtaining module 410 is incorrect, then the processing module 420 is further configured to call the control software to output second information. The second information is used as an instruction to obtain the first resource node again.

Specifically, in an embodiment of this application, the format of the first file includes one of: excel, xml, csv, or txt table.

Optionally, in some embodiments, the processing module 420 is further configured to call the control software to generate log information. The log information includes input information and output information. The output information includes first information and second information.

Figure 5:
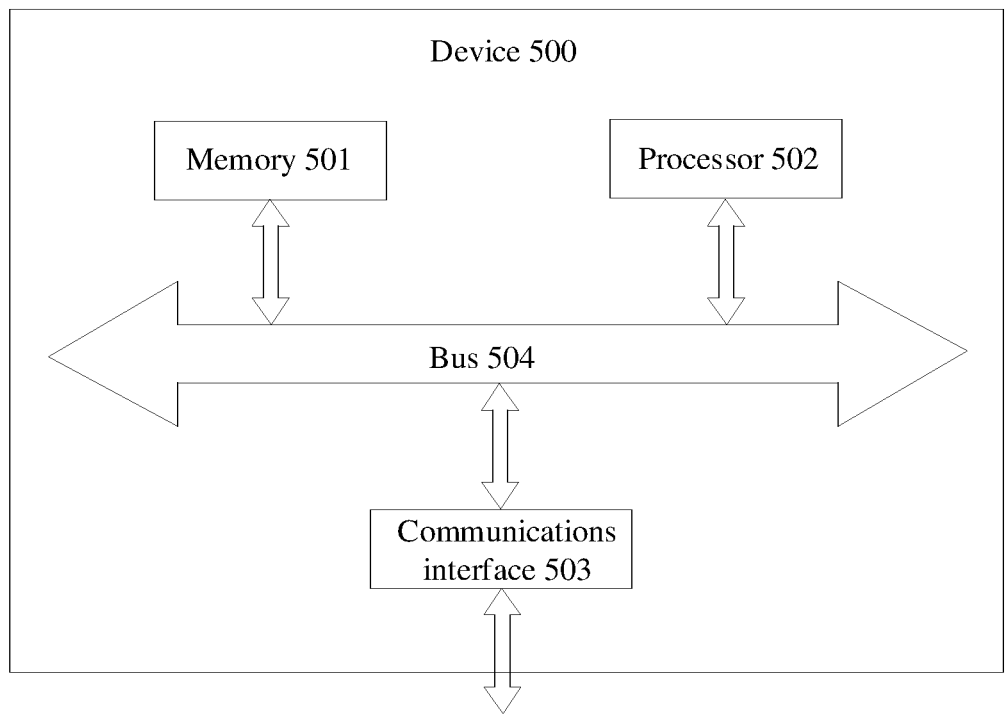
FIG. 5 is a schematic structural hardware diagram of a device for creating kinematic pair objects according to an embodiment of this application.

FIG. 5 is a schematic structural hardware diagram of a device for creating kinematic pair objects according to an embodiment of this application. As shown in FIG. 5, the device 500 includes a memory 501, a processor 502, a communications interface 503, and a bus 504. The memory 501, the processor 502, and the communications interface 503 are connected to each other by the bus 504 to implement communications connection between each other.

The memory 501 may be a read-only memory (ROM), a static storage device, or a random access memory (RAM). The memory 501 may store a program. When the program stored in the memory 501 is executed by the processor 502, the processor 502 and the communications interface 503 are configured to perform the steps of the method for creating kinematic pair objects according to an embodiment of this application.

The processor 502 may be a general-purpose central processing unit (CPU), a microprocessor, an application specific integrated circuit (ASIC), a graphics processing unit (GPU), or one or more integrated circuits. The processor is configured to perform relevant programs to implement the functions of different units in the device for creating kinematic pair objects according to an embodiment of this application or perform the method for creating kinematic pair objects according to an embodiment of this application.

Alternatively, the processor 502 may be an integrated circuit chip capable of processing signals. In an implementation process, steps of the method for creating kinematic pair objects according to an embodiment of this application may be performed by an integrated logic circuit in the hardware form or an instruction in the software form in the processor 502.

The processor 502 may be a general-purpose processor, a digital signal processor (DSP), an ASIC, a field programmable gate array (FPGA), or another programmable logic device, a discrete gate, or a transistor logic device, or a discrete hardware component. The processor can implement or perform the methods, steps, and logic block diagrams disclosed in an embodiment of this application. The general-purpose processor may be a microprocessor, or the processor may be any conventional processor or the like. The steps of the method disclosed in an embodiment of this application may be directly performed by a hardware processor, or performed by a combination of hardware and software modules in the processor. The software modules may be located in a mature storage medium in the art, such as a random access memory, a flash memory, a read-only memory, a programmable read-only memory, an electrically erasable programmable memory, a register, or the like. The storage medium is located in the memory 501. The processor 502 reads the information in the memory 501, and works together with hardware to perform the functions of different units included in the device for creating kinematic pair objects according to an embodiment of this application, or perform the method for creating kinematic pair objects according to an embodiment of this application.

The communications interface 503 may use, but without being limited to, a transmit-and-receive device such as a transceiver to implement communication between the device 500 and another device or a communications network. For example, traffic data of an unknown device may be obtained through the communications interface 503.

The bus 504 may include a path configured to transfer information between components (for example, memory 501, processor 502, and communications interface 503) of the device 500.

It is hereby noted that although the device 500 shown in the drawing includes just a memory, a processor, and a communications interface, a person skilled in the art understands that the device 500 in specific implementations may include other components required for normal operation. In addition, a person skilled in the art understands that the device 500 may further include a hardware component configured to implement another additional function as specifically required. Moreover, a person skilled in the art understands that the device 500 may include just the components necessary to implement an embodiment of this application, but without including all components shown in FIG. 5.

An embodiment of this application further provides a computer-readable storage medium configured to store program code executable by a device. The program code includes an instruction for performing the steps in the method for creating kinematic pair objects.

An embodiment of this application further provides a computer program product. The computer program product includes a computer program stored on a computer-readable storage medium. The computer program includes a program instruction. When executed on a computer, the program instruction causes the computer to perform the method for creating kinematic pair objects.

The computer-readable storage medium may be a transitory computer-readable medium or a non-transitory computer-readable storage medium.

A person skilled in the art is clearly aware that for convenience and brevity of description, a detailed working process of the device described above may be learned by referring to the corresponding process in the foregoing method embodiment, details of which are omitted here.

In the several embodiments provided in this application, it is understandable that the disclosed device and method may be implemented in other manners. For example, the described device embodiment is merely illustrative. For example, the division of the device into several units is merely a type of logic function division, and the device may be divided in other manners in practical implementations. For example, a plurality of units or components may be combined or integrated into another system, or some features may be ignored or skipped. In addition, a mutual coupling or direct coupling or communications connection illustrated or discussed herein may be an indirect coupling or communications connection implemented through some interfaces, devices, or units, and may be in electrical, mechanical or other forms.

The terms used herein are merely used to describe an embodiment but not to limit the claims. Unless otherwise expressly specified in the context, a noun in the singular form preceded by "a", "an", or "the" used in the description of an embodiment or claims is intended to include the plural form of the noun. Similarly, the term "and/or" used herein means any and all possible combinations of one or more relevant items recited. In addition, when used in this application, the terms "include" and "comprise" mean the presence of stated features, entirety, steps, operations, elements, and/or components, but without excluding the presence or addition of one or more other features, entirety, steps, operations, elements, components, and/or any combination thereof.

The aspects, implementation manners, implementations, or features in a described embodiment can be used alone or in any combination. Each aspect of an embodiment described herein may be implemented by software, hardware, or a combination of hardware and software. The described embodiment may be embodied by a computer-readable medium that stores computer-readable code. The computer-readable code includes an instruction executable by at least one computing device. The computer-readable medium may be correlated with any data storage device capable of storing data that is readable by a computer system. Examples of the computer-readable medium may include a read-only memory, a random-access memory, a compact disc read-only memory (CD-ROM), a hard disk drive (HDD), a digital video disc (DVD), magnetic tape, an optical data storage device, and the like. The computer-readable medium may be distributed in a computer system connected over a network so that the computer-readable code can be stored and executed in a distributed manner.

The foregoing technical description may be read by reference to the drawings appended hereto. The drawings form a part hereof and have illustrated the implementations in accordance with the described embodiments. Although the embodiments are described in sufficient detail to enable a person skilled in the art to implement the embodiments, the embodiments are non-restrictive so that other embodiments can be used, and changes may be made to the embodiments without departing from the scope of the described embodiments. For example, the order of operations illustrated in a flowchart is non-restrictive, and therefore, the order of two or more operations illustrated in the flowchart and described with reference to the flowchart may be changed according to several embodiments. As another example, in several embodiments, one or more operations illustrated in the flowchart and described with reference to the flowchart are optional or deletable. In addition, some steps or functions may be added to and embodiment disclosed herein, or the order between two or more steps may be permuted. All such variations are considered to be included in the disclosed embodiments and claims.

Moreover, terms are used in the foregoing technical description to enable a thorough understanding of the described embodiments. However, undue detail is not required to implement the described embodiments. Therefore, the foregoing description of embodiments is rendered for purposes of interpretation and description. The embodiments rendered in the foregoing description and the examples disclosed according to such embodiments are provided separately to add a context for ease of understanding of the described embodiments. The specification described above is not intended to be exhaustive or to limit the described embodiments to a precise form of this application. Several modifications, alternatives, and variations may be made based on the foregoing teachings. In some circumstances, well-known process steps have not been described in detail in order not to unnecessarily obscure the described embodiments.

Although this application has been described with reference to illustrative embodiments, various improvements may be made to the embodiments without departing from the scope of this application, and the components in this application may be replaced with equivalents. Particularly, to the extent that no structural conflict exists, various technical features mentioned in different embodiments may be combined in any manner. This application is not limited to the specific embodiments disclosed herein, but includes all technical solutions falling within the scope of the claims.

What is claimed is:

1. A method for creating kinematic pair objects, wherein kinematic pairs are comprised in a first facility, the first facility is equipped with control software, and the method comprises:
    obtaining a first file, wherein the first file comprises names of N kinematic pairs, N being an integer greater than or equal to 1;

calling the control software to read the names of the N kinematic pairs in the first file;

calling the control software to create N kinematic pair objects, wherein the N kinematic pair objects are determined based on the names of the N kinematic pairs read by the control software, and the names of the N kinematic pairs are in one-to-one correspondence to the N kinematic pair objects;

obtaining a first resource node; and in response to the first resource node being not obtained or a node type of the obtained first resource node being incorrect, calling the control software to output information used as an instruction to obtain the first resource node again.

2. The method according to claim 1, wherein calling the control software to create the N kinematic pair objects comprises:

calling the control software to create the N kinematic pair objects on the first resource node.

3. The method according to claim 1, further comprising:

calling the control software to create sub-objects of the N kinematic pair objects on the N kinematic pair objects, wherein the N kinematic pair objects correspond to the sub-objects of the N kinematic pair objects.

4. The method according to claim 3, wherein the sub-objects of the N kinematic pair objects comprise at least one of:

a link object, a joint object, and a pose object, wherein the link object comprises a parent link object and a child link object, the joint object is determined by the parent link object and the child link object, and the pose object comprises a pose open object and a pose closing object.

5. The method according to claim 1, wherein parameters of the N kinematic pair objects have identical default values.

6. The method according to claim 1, further comprising:

in response to the first file being not obtained or a format of the obtained first file being incorrect, calling the control software to output information used as an instruction to obtain the first file again.

7. The method according to claim 1, wherein a format of the first file comprises one of: excel, xml, csv, or txt table.

8. The method according to claim 1, wherein the kinematic pairs comprise: a cylinder shaft or a servo shaft.

9. The method according to claim 1, further comprising:

calling the control software to generate log information, wherein the log information comprises input information and output information, and the output information comprises first information used as an instruction to obtain the first file again and second information used as an instruction to obtain the first resource node again.

10. A device for creating kinematic pair objects, comprising:

a memory storing a program; and a processor configured to call the program from the memory and run the program to perform the method according to claim 1.

11. A non-transitory computer-readable storage medium, storing a computer program that, when executed on a computer, causes the computer to perform the method according to claim 1.

12. A device for creating kinematic pair objects, wherein kinematic pairs are comprised in a first facility, the first facility is equipped with control software, and the device comprises:

an obtaining module, configured to:

obtain a first file, wherein the first file comprises names of N kinematic pairs, N being an integer greater than or equal to 1; and obtaining a first resource node; and a processing module, configured to:

call the control software to read the names of the N kinematic pairs in the first file;

call the control software to create N kinematic pair objects, wherein the N kinematic pair objects are determined based on the names of the N kinematic pairs read by the control software, parameters of the N kinematic pair objects have identical default values, and the names of the N kinematic pairs are in one-to-one correspondence to the N kinematic pair objects;

in response to the first resource node being not obtained or a node type of the obtained first resource node being incorrect, call the control software to output information used as an instruction to obtain the first resource node again.

13. A method for creating kinematic pair objects, wherein kinematic pairs are comprised in a first facility, the first facility is equipped with control software, and the method comprises:

obtaining a first file, wherein the first file comprises names of N kinematic pairs, N being an integer greater than or equal to 1;

calling the control software to read the names of the N kinematic pairs in the first file;

calling the control software to create N kinematic pair objects, wherein the N kinematic pair objects are determined based on the names of the N kinematic pairs read by the control software, and the names of the N kinematic pairs are in one-to-one correspondence to the N kinematic pair objects; and calling the control software to create sub-objects of the N kinematic pair objects on the N kinematic pair objects, wherein the N kinematic pair objects correspond to the sub-objects of the N kinematic pair objects.

* * * * *